United States Patent [19]
Sato et al.

[11] Patent Number: 4,769,783
[45] Date of Patent: Sep. 6, 1988

[54] MAGNETIC BUBBLE MEMORY DEVICE

[75] Inventors: Toshihiro Sato, Kokubunji; Takashi Toyooka, Sayama; Teruaki Takeuchi, Kokubunji; Masatoshi Takeshita, Hachioji; Naoki Kodama, Tachikawa; Tadashi Ikeda, Tsukui; Ryo Suzuki, Hachioji, all of Japan

[73] Assignee: Hitachi, Ltd., Tokyo, Japan

[21] Appl. No.: 804,164

[22] Filed: Dec. 3, 1985

[30] Foreign Application Priority Data

Dec. 3, 1984 [JP] Japan .................................. 59-25401
Mar. 8, 1985 [JP] Japan .................................. 60-44709

[51] Int. Cl.$^4$ ............................................. G11C 19/08
[52] U.S. Cl. ....................................................... 365/36
[58] Field of Search .......................................... 365/36

[56] References Cited

U.S. PATENT DOCUMENTS

| | | | |
|---|---|---|---|
| 4,276,614 | 6/1981 | Nelson et al. | 365/36 |
| 4,394,746 | 7/1983 | Hirko et al. | 365/36 |
| 4,528,645 | 7/1985 | Sugita et al. | 365/36 |

Primary Examiner—James W. Moffitt
Attorney, Agent, or Firm—Antonelli, Terry & Wands

[57] ABSTRACT

In a magnetic bubble memory device employing ion-implanted tracks as minor loops for data storage, there is proposed a magnetic bubble memory element employing a minor loop having a folded structure and a turn composed of three tips formed convexly toward an ion-implanted area and two cusps as an inside turn for accomplishing the folding with a center as the ion-implanted area. In this inside turn, the line connecting between the two cusps of the turn includes a gradient in the range of 90 degrees to 120 degrees in relation to the ion-implanted straight line tracks.

6 Claims, 7 Drawing Sheets

MAGNETIC BUBBLE MEMORY DEVICE

BACKGROUND OF THE INVENTION

The present invention relates to a magnetic bubble memory device and particularly to a high density and large capacity bubble memory device.

Bubble memory devices using ion-implanted tracks, which replace the conventional memory devices using permalloy tracks, have been developed to realize high density devices. In the ion-implanted devices, as is disclosed in U.S. Pat. No. 3,828,329, ion-implanted tracks are fabricated by implantation of ions such as $H_2^+$, $He^+$ or $Ne^+$ into garnet films. Permalloy tracks have poor bias margin for short period, such as 4 μm or less, tracks. On the other hand, ion-implanted tracks have enough bias margin in case that the period of tracks is larger than 3 or 4 times of bubble diameter.

However, bubble control functions, fabricated by ion-implanted tracks and conductor patterns, have poor bias margin for a replicate gate and a swap gate where functions for a generator and a detector has enough bias margin. Hence, a hybrid bubble memory device, in which greater part of minor loops are composed of ion-implantation tracks and some part of minor loops and functions which are arranged both sides of minor loops, has been proposed. The hybrid device, as is disclosed in U.S. Pat. No. 4,528,645, utilize the relaxed permalloy tracks which have period 3 to 6 times as large as ion-implantation tracks, which improve characteristics of functions. An architecture of bubble memory devices using ion-implanted tracks for greater part of minor loops and permalloy tracks for some part of minor loops and functions which include a read major line 11, a write major line 12, a replicate gate 9, a swap gate 10, a generator 14 and a detector 13, is shown in FIG. 1. Region 2 of the minor loops is composed of ion-implanted tracks and region 3 and 4 of the minor loops are composed of permalloy tracks. The numbers 5, 6, 7 and 8 respectively denote the junctions between ion-implanted tracks and permalloy tracks. The nearly same design as conventional devices using permalloy tracks is applied to a replicate gate 9, a swap gate 10, a read major line 11, a write major line 12, a detector 13 and a generator 14. Minor loops using a folded structure, as is shown in FIG. 1, enables to relax the permalloy tracks' period in region 3 and 4, and the permalloy patterns included in junctions 5 to 8 and functions 9 to 14. The folded structure of minor loops is essential to realize a hybrid bubble memory device having good characteristics.

As for bubble memory devices using functions composed of only ion-implanted tracks and conductor patterns, relaxed ion-implanted tracks, having period 3 to 6 times as large as tracks for minor loop data storage area, are necessary to improve characteristics of gates. Therefore, for this device, the folded structure of minor loops is inevitable. For folded minor loops, corners 15 and 16 in which the bubble propagation direction is changed by 180 degree are provided. At an turn 15, as is shown in FIG. 2, the boundary of ion-implanted region 17 and non-implanted region 18 convex to ion-implanted region 17. Therefore, charged walls, which attract and propagate bubbles, are relatively easily formed. Enough bias field margin as large as that for straight line propagation is obtained for turns with the drive field amplitude down to 40 $\overline{O}e$. However, the inside turn 16 is surrounded by non-implanted region in 3 directions which have angle of 90 degree to each other. The inside turn is, specifically defined by the ion-implanted tracks where bubble propagation direction is changed by 180 degree and the implanted region surrounded by non-implanted region in 3 directions which have angle of 90 degree to each other and by implanted region in the remaining direction. Such structure of inside turns gives a bad effect on a formation of charged walls with drive field less than 50 $\overline{O}e$. The inside turn, as is shown in FIG. 3 and as is disclosed in BSTJ Vol. 59, No. 2, pp. 229 to 257, is composed of three cusps 19, 20 and 21 and two tips 22 and 23. This inside turn has been utilized for a memory device which has 4 μm period straight line tracks in minor loops and 1 μm diameter bubbles. The bias margin for the inside turn is the same as the straight line, which means good characteristics. However, when the ion-implanted tracks period is shrinked to 3 μm and bubble diameter to 0.9 μm, the bubble propagation characteristics of the inside turn is very poor. Operating region of the bubble propagation, which is defined by bias field and drive field is shown in FIG. 4. For 3 μm period straight tracks, bubbles are stably propagated with the condition as shown by the area inside the curve 24. On the other hand, inside turn has very narrow operating region as shown by the area inside the curve 25. Relative bias margin value, which is defined by the bias margin width over the mean bias field value of the upper end and lower end, is larger than 10% for straight line. Hence, inside turn has only 2% relative bias field margin or 60 $\overline{O}e$ drive field and bubbles cannot propagate the turn with device field less than 50 $\overline{O}e$.

As a result of investigating the bubble propagation errors at the inside turns, it turns out that the magnetic pole strength is weak at the tip 23 and the cusp 20 as is shown in FIG. 3. The charged wall is a kind of magnetic wall having magnetic charge which is formed by oppositely magnetized ion-implanted layers near the boundary of ion-implanted region 17 and non-implanted region 18.

The magnetization of the ion-implanted layer tends to be aligned in the easily magnetized directions 27, 28 and 29 shown in FIG. 5 because of the 120°-symmetry of magnetic garnet film. In order to generate the charged wall near the cusp 20, the magnetization of the area near it must be aligned in the directions 30 and 31 shown in FIG. 5. However, both of these directions 30 and 31 are the directions in which magnetization is hard to align. The directions 30 and 31 are opposite to easily magnetized directions 28, 29 respectively. Hence, the magnetic pole of the charged wall is weak in the area near the cusp 20.

Similarly, the charged wall at the tip 23 is generated by aligning the magnetization near the tip in the directions 32 and 33 shown in FIG. 6. The direction 32 is opposite to the easily magnetized direction 28 and the direction 33 is substantially opposite to the easily magnetized direction 27. These two directions 32 and 33 are the directions hard to magnetize. As a result, at the tip 23, the magnetic pole of the charged wall is weak, Consequently, in the inside turn composed of the two tips 22 and 23 and the three cusps 19, 20 and 21, as shown in FIG. 3, the bias field margin of magnetic bubble propagation is very poor.

SUMMARY OF THE INVENTION

It is an object of the present invention to provide an ion-implanted magnetic bubble memory device having inside turns with excellent bubble propagation characteristics. For this object, the boundary between the ion-implanted region and the non-ion-implanted region of the inside turn area must be properly designed. That is, the direction of the boundary between the ion-implanted region and the non-ion-implanted region of the inside turn should be designed to be as close as possible to the easily magnetized directions shown in FIG. 5. More particularly, as shown in FIGS. 7 and 8, it is possible to realize an inside turn with excellent characteristics with a design in which the inside turn is composed on one tip 34 and two cusps 19 and 21 and in which the direction along the boundary of the ion-implanted region and non-implanted region in the tip is closer to the easily magnetized directions 27, 28 and 29.

DESCRIPTION OF THE PREFERRED EMBODIMENTS

Figure 1:
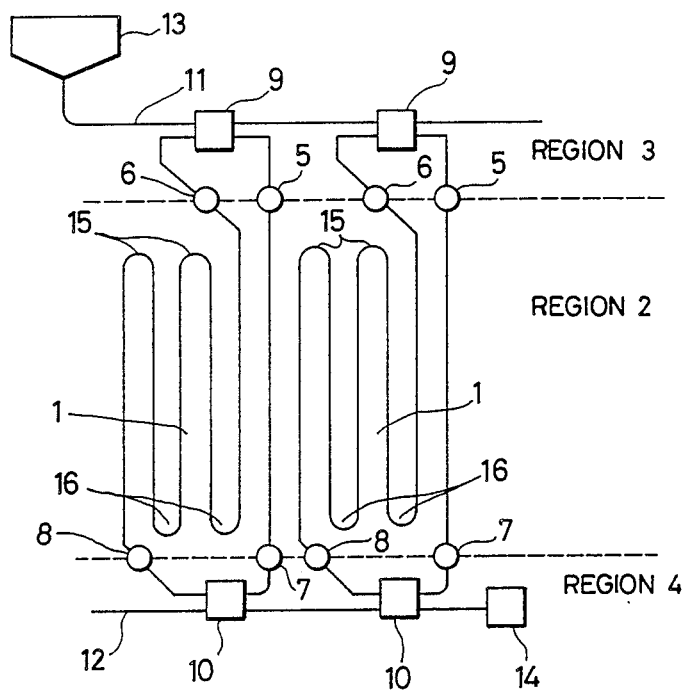
FIG. 1 is a view showing the construction of a hybrid magnetic bubble memory device using ion-implanted tracks and permalloy tracks.
Figure 2:
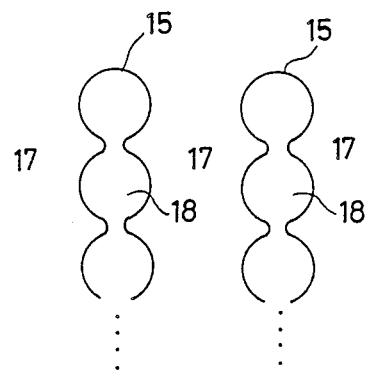
FIG. 2 is a view showing an outside turn using the ion-implanted tracks.
Figure 3:
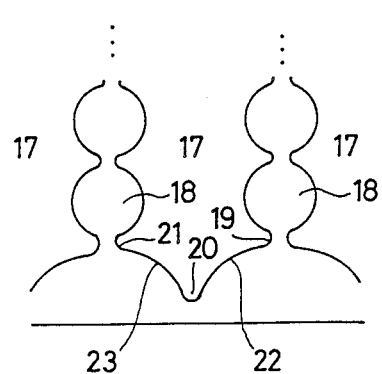
FIG. 3 is a view showing a conventional inside turn design.
Figure 4:
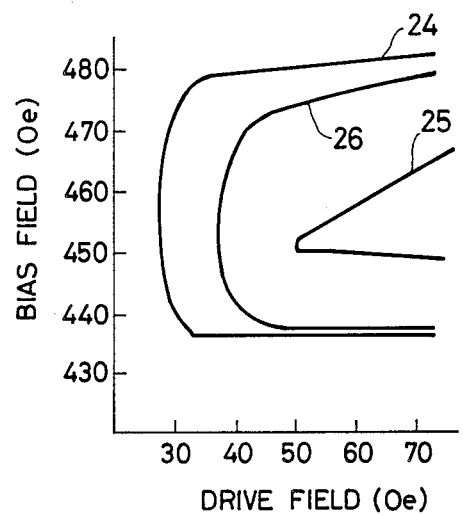
FIG. 4 is a graph showing bubble propagation characteristics of ion-implanted straight tracks and the conventional inside turn.
Figure 5:
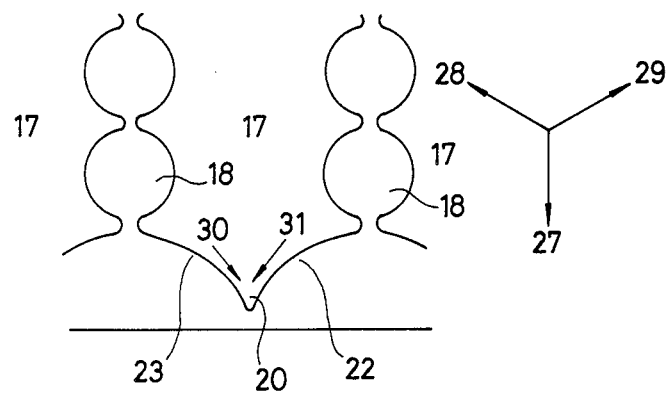
FIG. 5 is a view showing magnetization of an ion-implanted layer in a cusp part of the conventional inside turn.
Figure 6:
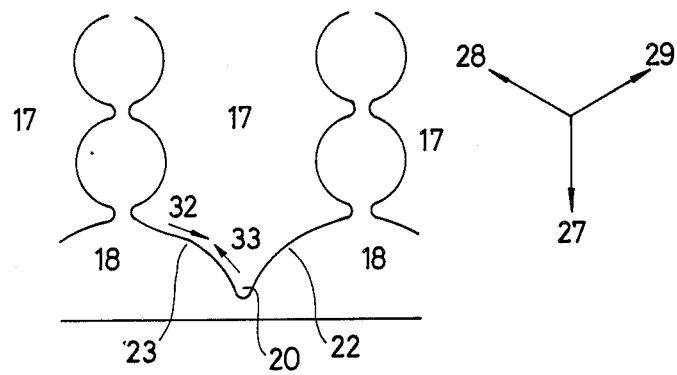
FIG. 6 is a view showing magnetization of an ion-implanted layer in a tip part of the conventional inside turn.
Figure 7:
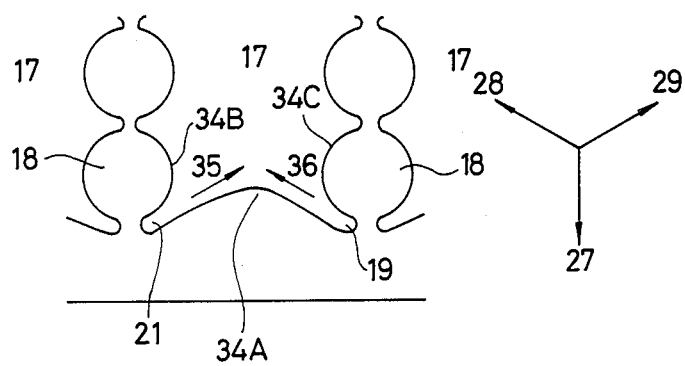
FIG. 7 is a view showing a first embodiment of an inside turn according to the present invention.
Figure 8:
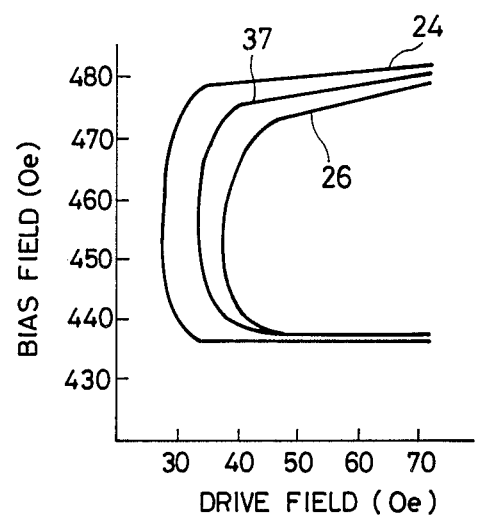
FIG. 8 is a graph showing magnetic bubble propagation characteristics in the first embodiment of the inside turn according to the present invention.

FIG. 7 shows a first embodiment of the present invention. The inside turn shown in FIG. 7 is composed of two cusps 19 and 21 and three tips 34A, 34B and 34C. In this construction, the boundary of an ion-implanted region and a non-implanted region on the left side of the tip 34 is in almost the same direction as the easily magnetized axis 29, that is, ±15° from the easily magnetized directions. Further, the boundary of the ion-implanted region on the right side of the tip 34 is in almost the same direction in relation to an easily magnetized direction 28. Thus, the magnetization 35 and 36 of the ion-implanted layer in this tip area is made sufficiently strong, which results in a strong magnetic pole of a charge wall generated by magnetizations 35 and 36. As a result, the desired bubble propagation characteristics in the tip part is greatly improved. Further, there are cases where ion-implanted tracks including inside turns as shown in FIG. 7 are utilized together with the permalloy tracks, as shown in FIG. 1. This can be similarly adapted for the embodiments shown in FIGS. 2 to 7. FIG. 8 shows the bubble propagation characteristics of the inside turn of the structure shown in FIG. 7. As shown in a curve 26, a sufficiently large bias margin, which approximates the characteristics curve 24 of straight tracks, can be obtained in the area where the drive field amplitude is larger than 40 $\overline{\text{O}}$e.

In the present embodiment, it is possible to obtain excellent bubble propagation characteristics by means of an inside turn composed of a tip and two cusps and further nearly aligning the boundary of the ion-implanted region and the non-implanted region with the easily magnetized directions of the ion-implanted layer.

Figure 9:
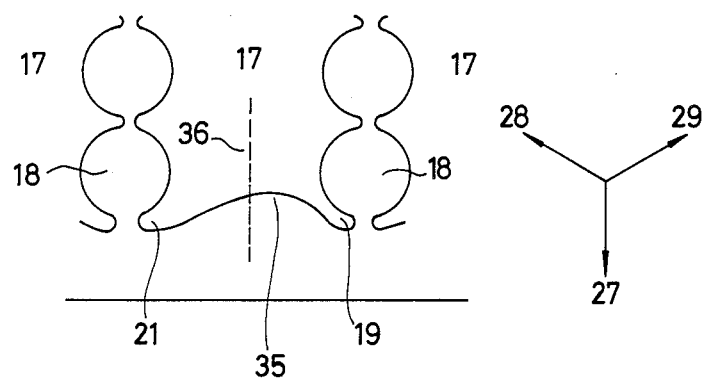
FIG. 9 is a view showing a second embodiment of an inside turn according to the present invention.

A second embodiment of the present invention is shown in FIG. 9. In this embodiment, the form of the tip 34 shown in FIG. 7 is designed to be asymmetric. Thus, this form is made to be the boundary of the ion-implanted area made by shifting a vertex of the tip 34 to the cusp 19 side in relation to a straight line at the same distance from each of cusps 19 and 21 shown in FIG. 9. In this embodiment, the boundary of the ion-implanted and non-implanted region forming a tip 35 is formed to be aligned with easily magnetized axes 28 and 29 of the ion-implanted layer. The advantages obtained by employing this configuration are shown as follows.

In the first embodiment shown in FIG. 7, the upper limit of a bias field margin is lower than that of the straight tracks shown in FIG. 8 because of the failure to remove the bubbles from the cusp 19. With a high bias field condition, the bubble diameter in the cusp 19 is small. According to the design shown in FIG. 7, the charged wall removing a bubble from this cusp 19 is generated at a distance from the cusp 19 equal to the bubble radius and is then propagated along the tip 34 toward the cusp 21. In the high bias field region, the bubble radius is small, which results a failure of bubble removing from the cusp. Since the tip of the inside turn is made to be a tip 35 which is asymmetric in relation to the central line 17 as shown in FIG. 9, the charged wall can be generated near the cusp 19 so that the bias field margin can be made wider as shown in a curve 37 in FIG. 8.

Figure 10:
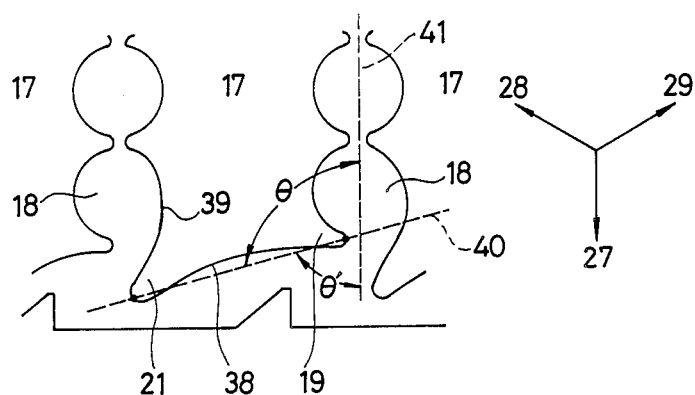
FIG. 10 is a view showing a third embodiment of an inside turn according to the present invention.
Figure 11:
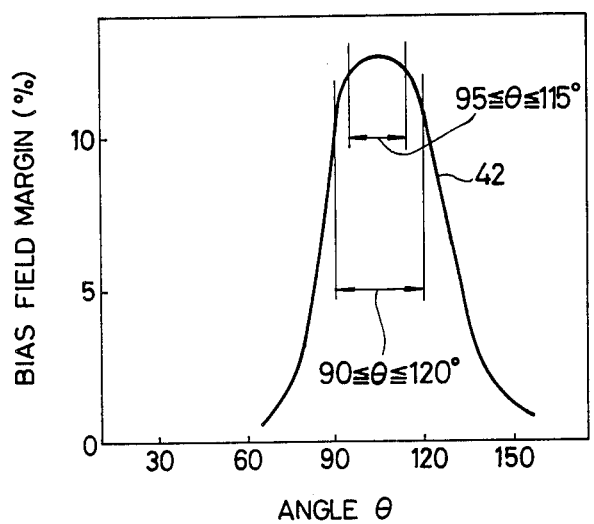
FIG. 11 is a graph showing the relation between a bias magnetic margin and an angle $\theta$ formed by the line connecting two cusps and the central line of an ion-implanted straight tracks.

A third embodiment of the present invention is shown in FIG. 10. The angle $\theta$, which is formed by a line 40 connecting the cusps 19 and 21 of the inside turn as shown in FIG. 7 and a central line of ion-implanted tracks, is 90 degree. However, in the third embodiment, $\theta$ is defined as a value in the range from 90° to 120°. By using the $\theta$ value, the direction of the boundary of an ion-implanted region and an non-implanted region near the cusp 19 is close to an easily magnetized direction of the ion-implanted layer. Hence, it is possible to generate a charged wall close to the cusp 19. Due to this effect, the bubble propagation margin can be made wider by enlarging $\theta$ to more than 90 degrees. When $\theta$ is made larger, the charged wall which is propagated to the part of the tip 38 close to the cusp 21 is made weaker; consequently, the bubble propagation to the cusp 21 cannot be achieved. For the charged wall generation in the part of the tip 38 close to the cusp 21, magnetization in the opposite direction to the easily magnetized direction 29 is required along the boundary of an ion-implanted region and non-implanted region. Thus, when $\theta$ is made larger than 120°, the charged wall in the region near the cusp 21 is made weaker, and bubble propagation cannot be accomplished. Therefore, it is possible to obtain excellent characteristics for $\theta$ in a range from 90° to 120° ($\theta'$ is in the range from 60° to 90°), more preferably, for $\theta$ in the range from 95° to 115° ($\theta'$ is in the range from 65° to 85°). The relation between the bias field margin and the angle $\theta$ is shown in FIG. 11.

Figure 12A:
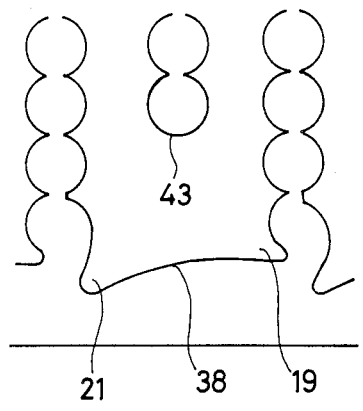
FIGS. 12(a)–12(d) are views showing fourth to seventh embodiments of an inside turn according to the present invention.
Figure 13A:
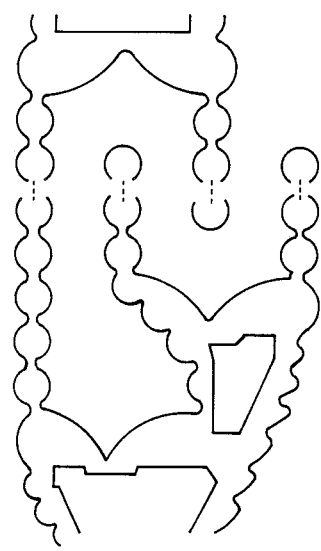
FIGS. 13(a)–13(b) are views showing a comb type of minor loop.
Figure 13B:
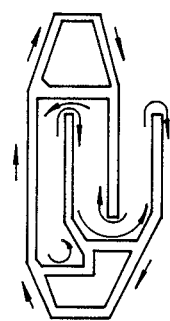

A fourth embdiment of the present invention is shown in FIG. 12(a). This inside turn is an example made by adapting a inter-digital type structure of a minor loop shown in FIG. 13 (which is disclosed in U.S. patent application Ser. No. 752,587 in detail) to the inside turn employing the structure shown in FIG. 10. The inter-digital type structure of minor loop shown in FIG. 13 means the structure formed by inserting another straight tracks between two straight tracks of the minor loop.

Figure 12B:
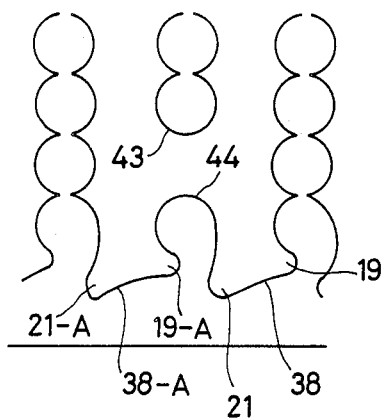

A fifth embodiment of the present invention, as shown in FIG. 12(b), is designed to combine two inside turns shown in FIG. 10 with an outside turn 44 in a interdigital type structure of minor loop for the purpose of making one inside turn as a whole.

Figure 12C:
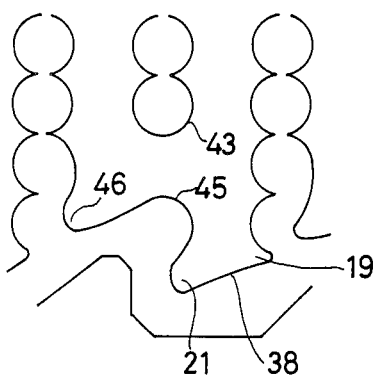

A sixth embodiment of the present invention is, as shown in FIG. 12(c), a variation of the fifth embodiment. In this embodiment, the tip 38-A and the cusp 19-A area deleted by transforming the outside turn 44 shown in FIG. 12(b) and connecting an outside turn 45 to a straight track through a cusp 46.

Figure 12D:
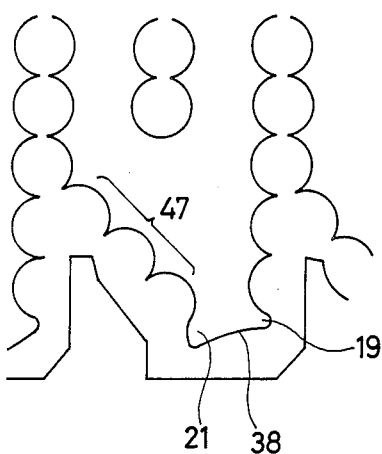

A seventh embodiment of the present invention is, as shown in FIG. 12(d), a variation of the fourth embodiment shown in FIG. 4(a). The inside turn is composed of the tip 38 and the cusps 19 and 21, similar to the fourth embodiment as shown in FIG. 12(a), and a straight, inclined track 47 is added to the end of the inside turn 21 so as to connect the inside turn 21 with a minor loop straight track in the left side.

The bubble propagation characteristics and $\theta$-dependency of the above-stated embodiments 4 to 7 are almost similar to those of the embodiment 3.

What is claimed is:

1. A magnetic bubble memory device comprising inside turns connected to at least one of ion-implanted tracks formed by selectively implanting ions and changing the propagation direction of magnetic bubbles about 180 degrees, wherein a boundary between an ion-implanted region and anon-ion-implanted region and forming said inside turn is composed of: first and second tips having convex forms perpendicular to the propagation direction of magnetic bubbles in said ion-implanted tracks and toward said ion-implanted area, two cusps respectively connected with said first and second tips, and a third tip connected with said two cusps, said third tip having a concave form toward said non-implanted area, and wherein said boundary of the ion-implanted region and non-implanted region forming said third tip is almost in the same direction with respect to the easily magnetized directions of the ion-implanted layers forming said ion-implanted region nearby the said two cusps connected to both sides of said third tip.

2. A magnetic bubble memory device comprising inside turns connected to at least one of ion-implanted tracks formed by selectively implanting ions and changing the propagation direction of magnetic bubbles about 180 degrees, wherein a boundary between an ion-implanted region and a non-ion-implanted region and forming said inside turn is composed of: first and second tips having convex forms perpendicular to the propagation direction of magnetic bubbles in said ion-implanted tracks and toward said ion-implanted area, two cusps respectively connected with said first and second tips, and a third tip connected with said two cusps, said third tip having a convex form toward said ion-implanted area, and wherein a vertex of said third tip exists at the location shifted to the reverse direction in relation to the direction of propagation of magnetic bubbles in said third tip in relation to a straight line dividing into two a central line of said ion-implanted tracks respectively connected with both ends of said inside turn.

3. A magnetic bubble memory device comprising inside turns connected to at least one of ion-implanted tracks formed by selectively implanting ions and changing the propagation direction of magnetic bubbles about 180 degrees, wherein a boundary between an ion-implanted region and a non-ion-implanted region and forming said inside turn is composed of: first and second tips having convex forms perpendicular to the propagation direction of magnetic bubbles in said ion-implanted tracks and toward said ion-implanted area, two cusps respectively connected with said first and second tips, and a third tip connected with said two cusps, said third tip having a convex form toward said ion-implanted area, and wherein the angle made by a line connecting the vertexes of said two cusps crossing the central line of said ion-implanted tracks is in the range of 90 degrees to 120 degrees or of 60 degrees to 90 degrees.

4. A magnetic bubble memory device comprising inside turns connected to at least one of ion-implanted tracks formed by selectively implanting ions and changing the propagation direction of magnetic bubbles about 180 degrees, wherein a boundary between an ion-implanted region and a non-ion-implanted region and forming said inside turn is composed of: first and second tips having convex forms perpendicular to the propagation direction of magnetic bubbles in said ion-implanted tracks and toward said ion-implanted area, two cusps respectively connected with said first and second tips, and a third tip connected with said two cusps, said third tip having a convex form toward said ion-implanted area, and wherein the angle made by a line connecting the vertexes of said two cusps crossing the central line of said ion-implanted tracks is in the range of 95 degrees to 115 degrees or of 65 degrees to 85 degrees.

5. The magnetic bubble memory device according to claim 1, characterized by having permalloy tracks with said ion-implanted tracks.

6. A magnetic bubble memory device according to claim 1, wherein said inside turn is composed only of said first, second and third tips and said two cusps connected with said first and second tips, and said tip being connected between said two cusps.

* * * * *